United States Patent [19]

Liu

[11] Patent Number: 4,552,831

[45] Date of Patent: Nov. 12, 1985

[54] FABRICATION METHOD FOR CONTROLLED VIA HOLE PROCESS

[75] Inventor: Cheng-Yih Liu, San Jose, Calif.

[73] Assignee: International Business Machines Corporation, Armonk, N.Y.

[21] Appl. No.: 576,991

[22] Filed: Feb. 6, 1984

[51] Int. Cl.[4] .......................... G03C 5/00; B05D 3/06
[52] U.S. Cl. .................................... 430/296; 430/325; 430/326; 430/327; 156/628; 427/38; 427/40
[58] Field of Search ............... 430/327, 296, 325, 326; 156/628; 427/38, 40

[56] References Cited

U.S. PATENT DOCUMENTS

| | | | |
|---|---|---|---|
| T883,005 | 2/1971 | Schuller et al. | 96/36.2 |
| 3,816,196 | 6/1974 | La Combe | 156/8 |
| 3,879,597 | 4/1975 | Bersin et al. | 219/121 P |
| 3,920,483 | 11/1975 | Johnson, Jr. | 148/1.5 |
| 4,187,331 | 2/1980 | Ma | 430/328 |

FOREIGN PATENT DOCUMENTS 53-122427 10/1978 Japan .................................. 430/327

*Primary Examiner*—John E. Kittle
*Assistant Examiner*—José G. Dees
*Attorney, Agent, or Firm*—Joseph E. Kieninger

[57] ABSTRACT

A method for forming via holes having a rounded sidewall profile includes exposing a layer or organic positive photoresist to a formic gas plasma while the surface of the photoresist layer is bombarded with ions and electrons in a high voltage biased environment in which the photoresist layer is capacitively coupled. The photoresist layer may be exposed to UV light either before or after the formic gas plasma step.

7 Claims, 4 Drawing Figures

FABRICATION METHOD FOR CONTROLLED VIA HOLE PROCESS

DESCRIPTION

1. Technical Field

This invention relates to organic photoresist image layers and more particularly to a method for forming via holes having a rounded sidewall profile.

2. Background Art

Many microimaging processes such as, for example, integrated circuit fabrication require high temperatures. However, the upper limit of the processing temperature is often restricted by the resist masking material properties. The deformation of the resist image during high temperature baking (and especially for temperatures greater than about 130° C.) also places a constraint on the minimum image size of the resist mask pattern and hence the product geometry. Organic polymer resist image layers as shown in FIG. 1A after development are conventionally baked after development in order to improve resist adhesion and the physical properties of the resist. Baking is necessary so that the resist will withstand the chemicals used to etch the substrate and/or high temperature treatment such as metal deposition without separating from the substrate or being subject to image distorting flow.

The problem of flow is particularly important in microimaging processes such as integrated circuit manufacture where dimensions are becoming smaller as the technology advances and very fine lines must be preserved. The resist layer is baked to at least a temperature to which it is expected to be subjected during substrate processing. The baking process is itself limited to times and temperatures where image distortion due to flow is minimized. Where the permissible baking conditions are insufficient to provide the needed resist properties, then an alternate technique of improving resist stability must be used.

Previous techniques for improving resist image stability have included bombardment of the resist image by placing the image bearing substrate in a glow discharge on an electrode in a barrel reactor with an inert gas atmosphere such as argon, nitrogen, or mixtures of nitrogen and hydrogen as described in, for example, Defensive Publication No. T883,005, dated Feb. 2, 1971. Treatment of resist images in a glow discharge with oxygen is described for example in U.S. Pat. Nos. 3,816,196 and 3,920,483. Where the resist image bearing substrates are places in a plasma on an electrode such as, for example in the process described in T883,005 and subjected to ion bombardment, by choosing the correct conditions, stability of the resist layers to high temperatures can be achieved. However, in an electrodeless plasma treatment with oxygen or an inert gas, it has been found that resist image stability to temperatures of only up to about 210° C. can be provided.

The patent to Ma, U.S. Pat. No. 4,187,331, as shown in FIG. 1B describes a short electrodeless glow discharge treatment of 15 to 30 seconds using a fluorine containing atmosphere permits the heating or baking of the resist layer to temperatures of at least about 330° C. to thereby provide resist image stability during processing at very high temperatures. This process as well as the others described above preserve a metal lift-off lip or overhang profile by forming a stabilized or hardened layer 14 on the upper part of the photoresist layer. This hardened layer is undesirable when etching via holes where sharp quartz edges at the top are avoided and good metal coverage is desired.

The aforementioned Ma patent also described an electrodeless glow discharge treatment of about 2 minutes that converts the hardened photoresist surface layer which is formed in 15 to 30 seconds into a layer that the developer is more soluble in as shown in FIG. 1C. Such a treatment yields a rounding of the resist image profile which is desirable for etching via holes in quartz. This treatment, however, has some drawbacks. One problem is the lack of adhesion. The heating effect caused by the long treatment time causes reflow of the photoresist and this results in more shrinkage and smaller vias. This treatment is difficult to control in order to obtain vias having a diameter in the range of 1 to 2 microns.

SUMMARY OF THE INVENTION

It is a primary object of this invention to provide an improved method of forming via holes having a rounded sidewall profile.

It is another object of this invention to provide an improved method of forming via holes that are of the order of one micron in size.

These and other objects are accomplished by a method for forming via holes having a rounded sidewall profile which includes exposing a layer of organic positive photoresist to a formic gas plasma for 10 to 60 seconds while the surface of the photoresist layer is bombarded with ions and electrons in a high voltage biased environment in which the photoresist layer is capacitively coupled. The photoresist layer may be exposed to UV light either before or after the formic gas plasma step.

Other objects of this invention will be apparent from the following detailed description, reference being made to the following drawings in which specific embodiments of the invention are shown.

DESCRIPTION OF THE PREFERRED EMBODIMENT

Parallel plate reactors for the practice of the process of the invention are commercially available. For example, IPC parallel plate System and LFE 1002. These parallel plate reactors use a voltage of between 50 to 2000 volts with a preferred range of 300 to 400 volts to create a highly biased electric field.

In a parallel plate reactor the photoresist layer and the substrate are capacitively coupled. The high voltage bias provides directionality. As a result of the high voltage bias field the ions and electrons impinge onto the surface of the photoresist.

The first step is to provide a layer of an organic positive photoresist on the insulative layer, for example, $SiO_2$. Examples of an organic positive photoresist which is preferred in the practice of this invention is the AZ type of photoresist that is available commercially. It is understood that this invention will work with any positive photoresist.

Figure 1A:
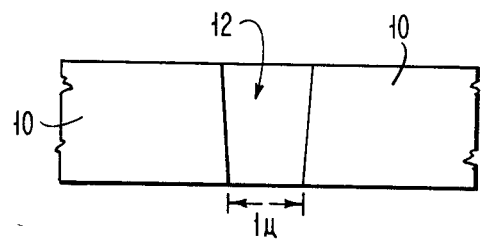
FIGS. 1A, 1B and 1C illustrate prior art photoresist profiles for forming via holes.
Figure 1B:
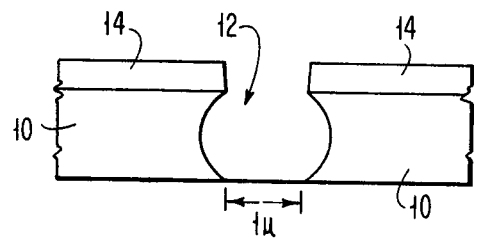
Figure 1C:
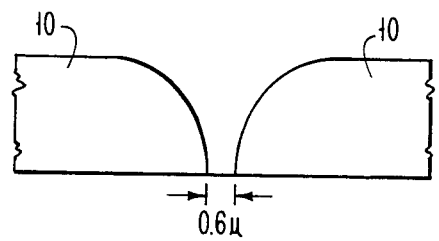
Figure 2:
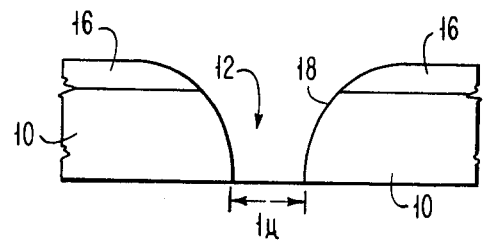
FIG. 2 illustrates a photoresist profile for forming via holes in accordance with this invention.

The next step is to expose the photoresist layer to a formic gas, that is, a gas containing nitrogen and hydrogen. The formic gas plasma is introduced into the parallel plate reactor with a gas flow of, for example, $NH_3^-$, $H^+$, $N^+$, $NH_3$., H ., N . and $e^-$ to provide a partial pressure of the order of 0.05~0.5 Torr. The next step is to bombard the surface of the photoresist layer with ions and electrons in the parallel plate reactor to provide a high voltage bias environment. This step passively couples the photoresist layer that is positioned on the insulative substrate (not shown). Bombarding the surface of the photoresist layer forms a layer 16 that has increased solubility of the photodeveloper as shown in FIG. 2. The bombarding step is carried out for between 10 to 60 seconds with a preferred time being between 15 to 25 seconds. The longer the exposure time the thicker the layer 16 is. Exposure times of the order of 15 to 25 seconds provide a via hole 12 having a rounded sidewall profile 18 after the subsequent development step. Bombarding the photoresist layer for times longer than 60 seconds results in the photoresist layer having poor adhesion and too deep penetration.

The photoresist layer is exposed to UV light. The UV light exposure step may be before the formic gas plasma step or alternatively the photoresist may be exposed to UV light after the formic gas plasma step. It is exposed to the UV light for a period of about 0.2~20 sec depending on the intensity of the exposure tool.

Forming via holes having a rounded sidewall profile in accordance with this invention is desirable for via holes of the one micron size.

Although preferred embodiments have been described, it is understood that numerous variations may be made in accordance with the principles of this invention.

I claim:

1. A method for forming via holes having a rounded sidewall profile comprising the steps of:
   providing a layer of organic positive photoresist on the insulation layer,
   exposing said photoresist layer to a formic gas plasma,
   bombarding the surface of said photoresist layer with ions and electrons in a high voltage biased environment in which said photoresist layer is capacitively coupled whereby the solubility of the upper portion of said photoresist layer in a developer solution is increased,
   imagewise exposing said photoresist layer to UV light, and
   developing said photoresist layer.

2. A method as described in claim 1 whereby the step of imagewise exposing said photoresist layer to UV light is carried out before the formic gas plasma step.

3. A method as described in claim 1 whereby said organic positive photoresist is of the AZ-type.

4. A method as described in claim 1 whereby said photoresist layer is exposed for 10 to 60 seconds to the ion and electron bombardment.

5. A method as described in claim 1 whereby said photoresist layer is exposed for 15 to 25 seconds to the ion and electron bombardment.

6. A method as described in claim 1 whereby the voltage is 50 to 2000 volts.

7. A method as described in claim 1 whereby the voltage is 300 to 400 volts.

* * * * *